United States Patent

Eriksson

[11] Patent Number: 5,986,512
[45] Date of Patent: Nov. 16, 1999

[54] Σ-Δ MODULATOR-CONTROLLED PHASE-LOCKED-LOOP CIRCUIT

[75] Inventor: Håkan Bengt Eriksson, Lund, Sweden

[73] Assignee: Telefonaktiebolaget L M Ericsson (publ), Stockholm, Sweden

[21] Appl. No.: 08/989,864

[22] Filed: Dec. 12, 1997

[51] Int. Cl.[6] .......................... H03L 7/197; H03K 23/68; H04L 27/12
[52] U.S. Cl. .............. 331/16; 331/25; 332/100; 332/127; 377/48
[58] Field of Search .......... 331/16, 25; 377/48; 332/100, 127

[56] References Cited

U.S. PATENT DOCUMENTS

| 4,410,954 | 10/1983 | Wheatley, III | 364/701 |
| 5,038,117 | 8/1991 | Miller | 331/16 |
| 5,079,521 | 1/1992 | Gaskell et al. | 331/1 A |
| 5,305,362 | 4/1994 | Miller | 377/48 |
| 5,825,253 | 10/1998 | Mathe et al. | 331/1 A |

FOREIGN PATENT DOCUMENTS

| 0 515 154 A1 | 11/1992 | European Pat. Off. |
| 0 788 237 A1 | 8/1997 | European Pat. Off. |

OTHER PUBLICATIONS

*Sigma Delta Modulator with a Random Output Bit Stream of Specified 1/0 Average Ratio* by Itzhak Shperling, XP 000349609; Motorola Technical Developments, vol. 18, Mar. 1993, pp. 156–160.

Primary Examiner—Siegfried H. Grimm
Attorney, Agent, or Firm—Jenkens & Gilchrist P.C.

[57] ABSTRACT

A ΣΔ modulator-controlled, phase-locked-loop circuit, and an associated method, generates a frequency-regulated signal which does not exhibit undesired tones. Dithering signals are generated and are provided to a ΣΔ modulator. The ΣΔ modulator forms a division-factor control signal used to control the division factor of a frequency divider forming a portion of the PLL circuit. The dithering signals applied to the ΣΔ modulator reduce the likelihood that the ΣΔ modulator shall enter a limit cycle and generate repetitive output signals.

31 Claims, 4 Drawing Sheets

Σ-Δ MODULATOR-CONTROLLED PHASE-LOCKED-LOOP CIRCUIT

The present invention relates generally to a PLL (phase-locked-loop) circuit, such as a PLL forming a portion of a radiotelephonic device. More particularly, the present invention relates to a ΣΔ modulator-controlled PLL circuit. Dithering signals are generated and are provided to the ΣΔ modulator. The ΣΔ modulator forms a division-factor control signal of values, in part, determined by the dithering signals. The dithering signals are at least pseudo-random in nature, and their application to the ΣΔ modulator reduces the likelihood that the ΣΔ modulator shall enter a limit cycle and generate spurious, repetitive output signals.

Because the ΣΔ modulator is less likely to enter a limit cycle and generate repetitive output signals, control signals formed therefrom for controlling the PLL circuit make the occurrence of unwanted tones in a frequency-regulated signal formed by the ΣΔ modulator-controlled PLL circuit unlikely.

The ΣΔ modulator-controlled circuit, in one implementation, forms a frequency synthesizer. In another implementation, the ΣΔ modulator-controlled PLL circuit forms a modulator for generating a modulated signal, such as a GMSK (gaussian minimum shift keying) -modulated signal.

BACKGROUND OF THE INVENTION

A communication system is operable to communicate information between a transmitting station and a receiving station by way of a communication channel. A radio communication system is a communication system in which the communication channel by which information is communicated between the transmitting and receiving stations is formed upon a portion of the electromagnetic spectrum. A cellular communication system is exemplary of a multi-user, radio communication system.

The portion of the electromagnetic spectrum allocated to a radio communication system is typically bandwidth-limited. That is to say, only a limited spectrum portion, referred to as "bandwidth", is permitted to be used by a particular radio communication system. All of the radio channels available for use in the system must be defined within the allocated bandwidth. The capacity of the radio communication system is sometimes limited by the bandwidth allocated to the system.

Efficient utilization of the bandwidth allocated to the radio communication system is therefore required to ensure that the communication capacity of the radio communication system is maximized. Manners by which to utilize more efficiently the bandwidth allocated to a radio communication system permits greater numbers of channels to be defined within the allocated bandwidth.

Advancements in technologies have facilitated more efficient use of the bandwidth allocated for radio communication systems. Radio communication systems in which advanced communication technologies have been implemented permit increased numbers of communication channels to be defined within the allocated bandwidth, thereby to increase the effective communication capacity of the system.

For instance, in some radio communication systems, digital modulation techniques have been implemented to increase the effective capacity of the communication system. When digital modulation techniques are utilized in a radio communication system, a lessened amount of frequency spectrum is required for the communication of information between sending and receiving stations operable therein. When a digital modulation technique is utilized, a single carrier can be divided into a plurality of channels so that a single carrier can be used to transmit information between a plurality of sending and receiving stations.

In a radio communication system utilizing a digital modulation technique, as well as other modulation techniques, information is modulated upon a carrier of a frequency to form a modulated signal centered at, or about, the carrier frequency upon which the radio channel is defined. The carrier upon which the information is modulated must be of frequency stability characteristics good enough to ensure that the modulated signal does not drift from the carrier upon which the channel is defined. Otherwise, if the carrier signal upon which the information is modulated is not of an adequate frequency stability, a modulated signal transmitted by a transmitting station might drift away from a designated channel and interfere with ongoing communications on another channel.

Attempts are made, therefore, to ensure that the carrier upon which information is modulated is of acceptable frequency stability characteristics. Phase-locked-loop (PLL) circuits, for instance, oftentimes form portions of a transmitting station. A phase-locked-loop (PLL) circuit typically includes a voltage-controlled oscillator (VCO) having an output oscillating signal of a frequency which is related to an input reference signal. A signal related to the output oscillating signal generated by the VCO is compared with the input reference frequency. Responsive to phase differences between such signals, a voltage is applied to the VCO either to increase, or to decrease, the frequency of the output, oscillating signal.

A frequency divider is typically positioned in a feedback loop of the PLL circuit. The frequency divider divides the output oscillating signal by an integer value to form a frequency-divided signal. The frequency-divided signal forms the signal which is compared with the input reference signal. In some PLL circuits, the frequency divider can only divide the output oscillating signal by set, stepped amounts, e.g., integer amounts. And, the PLL circuit is able merely to generate output oscillating signals of set, stepped frequencies as the output frequency is equal to the reference frequency multiplied by the division factor of the frequency divider. The resolution of the output oscillating signals is therefore limited.

To improve resolution, some PLL circuits utilize fractional n synthesis by including a ΣΔ modulator. The division factor by which the frequency divider divides the output oscillating signal is determined by a signal generated by a ΣΔ modulator. Such an arrangement is sometimes referred to as a ΣΔ-controlled PLL circuit. Use of a ΣΔ modulator is advantageous as both higher-frequency resolution and higher bandwidth of the PLL is permitted. When a ΣΔ-controlled PLL circuit is formed, both cost and space efficiencies are provided. Also, such an arrangement permits continuous phase modulated signals to be generated. And, direct and digital control over modulation, as well as channel selection, can be provided in apparatus in which such an arrangement is embodied. U.S. Pat. No. 5,055,802, for instance, discloses a frequency synthesizer which utilizes a ΣΔ modulator.

However, particularly when an input signal applied to the ΣΔ modulator is of a constant frequency value, the modulator is susceptible to enter into what is referred to as a "limit cycle." The division-factor control signal might then begin to repeat itself. When such a signal is applied to the frequency divider of the PLL circuit, the output oscillating signal might exhibit unwanted tones. Such tones deleteriously effect operation of a sending, or receiving, station of which the ΣΔ modulator-controlled PLL circuit forms a portion.

While some manners have been developed to reduce problems associated with the generation of tones caused by repetitive behavior of the ΣΔ modulator, such manners are expensive and difficult to implement. For instance, feed-forwarding of an analog error signal to the PLL circuit to cancel the error caused by the repetitive behavior of the ΣΔ modulator is sometimes provided. Difficulty and expense results as matching of RF hardware is required and, in any event, component value uncertainty limits the successful implementation of such a solution.

A manner by which better to assure acceptable operation of a ΣΔ modulator of a ΣΔ modulator-controlled PLL circuit would therefore be advantageous.

It is in light of this background information related to PLL circuits that the significant improvements of the present invention have evolved.

SUMMARY OF THE INVENTION

The present invention, accordingly, advantageously provides a ΣΔ modulator-controlled PLL circuit. The ΣΔ modulator-controlled PLL circuit is operable in a manner in which repetitive behavior of the ΣΔ modulator is avoided, thereby to avoid the generation of unwanted tones as part of the output oscillating signal generated by the PLL circuit. The ΣΔ modulator-controlled circuit generates an output oscillating signal which is related to an input reference signal. While controlled by the ΣΔ modulator, the output oscillating signal does not exhibit signal tones of which conventional such circuits are susceptible of exhibiting.

In one aspect of the present invention, the ΣΔ modulator-controlled PLL circuit forms a frequency synthesizer for generating a stable, carrier frequency signal related to an input reference signal. Frequency input signals corresponding to the desired frequency of oscillation of the output oscillation signal generated by the frequency synthesizer are provided to the ΣΔ modulator. Signals related to the frequency input signals are summed with dithering signals, and the summed values are quantized during operation of the ΣΔ modulator. The output signal generated by the ΣΔ modulator forms a division-factor control signal which is used to control the division factor of a frequency divider of the PLL circuit. The output oscillating signal generated by the VCO of the PLL circuit is related to the input reference signal applied to the PLL circuit and to the frequency input signals applied to the ΣΔ modulator. Because pseudo-random dithering signals are also provided to the ΣΔ modulator and summed together with the signals related to the input frequency signals, the likelihood that the ΣΔ modulator might enter a limit cycle is reduced. Thereby, the output oscillating signal generated by the VCO is unlikely to contain unwanted tones.

The dithering signals are preferably applied just prior to quantization so that dithering noise generated by the dithering signals and quantization noise generated by the quantization are similarly treated by the noise shaping of the ΣΔ modulator.

In another aspect of the present invention, the frequency synthesizer is used to form a portion of an IQ modulator. The IQ modulator is used, e.g., to form a portion of a radio transceiver operable in a cellular communication system. The IQ modulator is implemented, for instance, in the radio base station of the cellular communication system. The IQ modulator is similarly also implemented in a mobile terminal of the cellular communication system.

Output oscillating signals generated by the VCO form carriers, or other up-mixing signals, upon which I- and Q-component portions of information to be communicated during operation of the communication system are modulated. The advantages of utilization of a ΣΔ-controlled PLL circuit are provided but without the problems associated with the generation of unwanted tones associated with conventional ΣΔ modulator-controlled PLL circuits.

In another aspect of the present invention, a modulator is provided by which to generate a modulated signal, such as a GMSK (gaussian minimum shift keying) signal. Information signals are provided as an input to the ΣΔ modulator. Dithering signals are also provided to the ΣΔ modulator and are combined with the information signals, prior to their application together to the ΣΔ modulator. The division-factor control signal generated by the ΣΔ modulator also includes the informational content of the information signal. Thereby, the VCO is regulated in the manner such that the output oscillating signal generated thereat forms a modulated signal, modulated with the information of the information signals provided to the ΣΔ modulator. Because the dithering signals are also used by the ΣΔ modulator, the ΣΔ modulator is less likely to enter into a limit cycle and generate repetitive outputs. Therefore, the output oscillating signal forming the modulated signal generated by the PLL circuit is unlikely to contain unwanted tones.

In other aspects of the present invention, the ΣΔ modulator-controlled PLL circuit is implemented as a frequency synthesizer forming a portion of a receiver circuit, such as a receiver circuit operable in a communication system, such as, e.g., a cellular communication system, a satellite communication system, or other radio communication system.

In these and other aspects, therefore, apparatus, and an associated method, generates a division-factor control signal for application to a frequency divider of a PLL (phase-locked-loop) circuit. The PLL circuit has a VCO (voltage-controlled oscillator) for generating a VCO output signal. The VCO is maintained in a desired relationship with an input reference signal. And, the VCO output signal is coupled to a feedback loop having a frequency divider for dividing the VCO output signal by a selected division-factor. Values of the division-factor control signal are determinative of the selected division factor. A dither signal generator generates dither signals of at least pseudo-random values. And, a noise shaper, such as a ΣΔ modulator, is coupled to receive frequency input signals having a first signal characteristic and also to receive the dither signals generated by the dither signal generator. The noise shaper sums together signals related to the frequency input signals and the dither signals. Responsive to the summed values formed therefrom, the division-factor control signal is generated. The division-factor control signal is formed of division-factor control signals having a second signal characteristic.

A more complete appreciation of the present invention and the scope thereof can be obtained from the accompanying drawings which are briefly summarized below, the following detailed description of the presently-preferred embodiments of the invention, and the appended claims.

DETAILED DESCRIPTION

Figure 1:
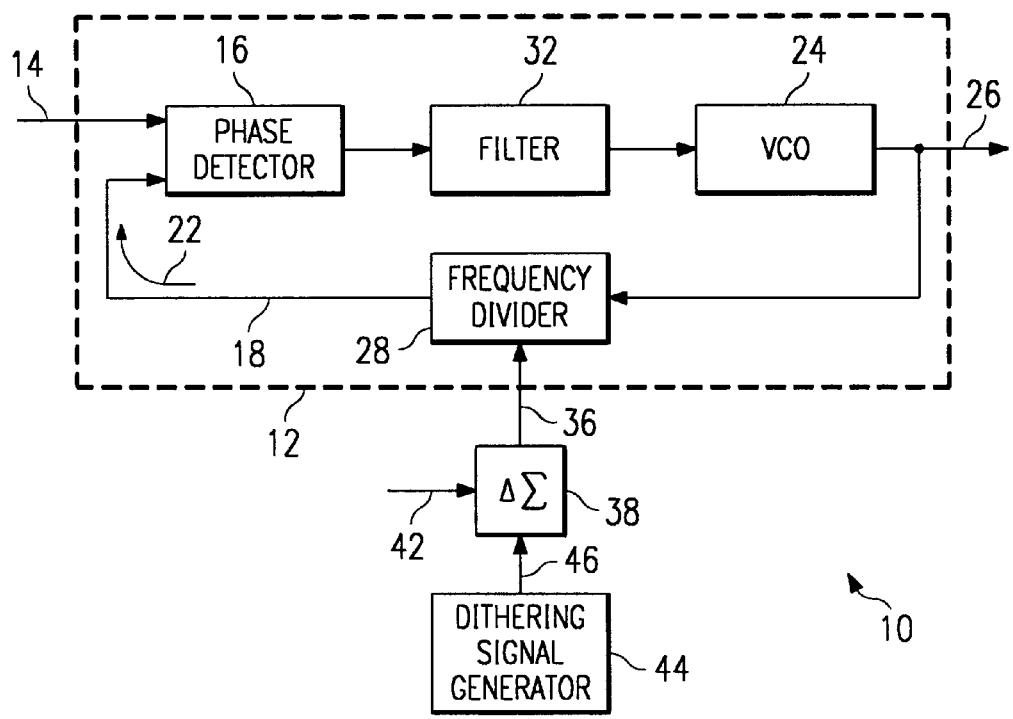
FIG. 1 illustrates a functional block diagram of a ΣΔ modulator-controlled PLL circuit of an embodiment of the present invention.

Turning first to FIG. 1, a ΣΔ modulator-controlled PLL circuit, shown generally at 10, of an embodiment of the present invention includes a PLL circuit 12. The PLL circuit 12 is coupled to receive, by way of the line 14, an input reference signal to which the PLL circuit 12 is to be regulated. The input reference signal applied on the line 14 is preferably of stable frequency characteristics.

When the circuit 10 forms a portion of a radio base station of a cellular communication system, for instance, the input reference signal generated on the line 14 is of frequency stability characteristics which meet, or exceed, frequency stability requirements set forth in specification standards pursuant to which the radio base station is operable. Analogously, when the circuit 10 forms a portion of a mobile terminal, the input reference signal provided on the line 14 is also of frequency stability characteristics which meet, or exceed, frequency stability requirements set forth in such specification standards.

The line 14 is coupled to a first input of a phase detector 16. A line 18 is coupled to a second input of the phase detector 16. The line 18 forms a portion of a feedback loop, here represented by the arrow 22. The feedback loop 22 is coupled to an output side of a VCO 24. And, the feedback loop 22 includes a frequency divider 28. When the feedback loop is coupled, as shown, an output oscillating signal generated by the VCO 24 is applied to the frequency divider 28. And, a frequency-divided signal generated by the frequency divider 28 is provided to the second input of the phase detector 16.

The PLL circuit 12 further includes a filter 32, coupled between the phase detector 16 and the VCO 24. The filter 32 is operable to filter signals generated by the phase detector 16.

During operation of the PLL circuit 12, the output oscillating signal generated on the line 26 is maintained in a frequency relationship with the input reference signal generated on the line 14. The output oscillating signal generated by the VCO 24 is provided to the frequency divider 28, and phase differences between the frequency-divided signal generated by the frequency divider 28 and the input reference signal generated on the line 14 are compared. The phase detector 16 generates a signal representative of phase differences between the signals applied thereto. After filtering of the signal by the filter 32, the VCO 24 is provided with a voltage signal representative of the phase differences detected by the phase detector 16. The frequency of oscillation of the VCO 24 is altered, i.e., "warped", responsive to such phase differences.

Thereby, the output oscillating signal generated by the VCO 24 becomes maintained in a frequency relationship to the input reference signal applied on the line 14. The PLL circuit 12 is self-regulating. That is to say, if the oscillation frequency of the output oscillating signal generated by the VCO 24 starts to drift out of regulation with the input reference signal, phase differences between the signals are detected by the phase detector 16, and the VCO 24 is warped to bring the VCO, and the signal generated therefrom, back into a desired relationship with the input reference signal.

The division factor is a value by which the frequency divider 28 divides the signal provided thereto. The frequency of the output oscillation signal generated by the VCO 24 equals the reference frequency of the input reference signal generated on the line 14 multiplied by the division factor by which the frequency divider divides the signal provided thereto.

The division factor by which the frequency divider 28 divides the signal provided thereto is determined by a division-factor control signal generated on the line 36 by a ΣΔ modulator 38. The ΣΔ modulator 38 receives, as an input, by way of the line 42, frequency input signals defining the frequency at which the output oscillation signal generated on the line 26 is to exhibit.

Dithering signals generated by a dithering signal generator 44 are also provided to the ΣΔ modulator 38, here by way of the line 46. The dithering signals and signals related to the frequency input signals are combined by the ΣΔ modulator 38, and the combined values are quantized during operation of the ΣΔ modulator.

The ΣΔ modulator is operable to shape the noise components of the frequency input signals applied thereto. That is to say, the modulator "pushes" the quantization noise generated during operation of the modulator up in frequency. The dithering signals are combined with the frequency input signals to randomize the signals which are quantized by the modulator. Randomizing of the signals reduces the likelihood that the ΣΔ modulator might enter a limit cycle and generate repetitive outputs. The signal generated by the modulator 38 forming the division-factor control signal generated on the line 36 forms a fractional n-filter synthesizer signal. Such operation permits the frequency of the output oscillation signal generated on the line 26 by the VCO 24 to be of any of many selected frequency values.

Figure 2:
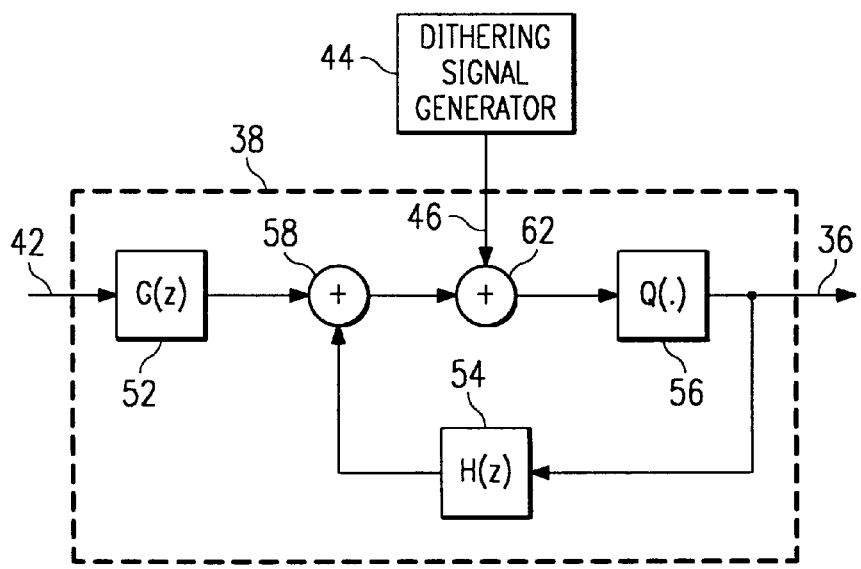
FIG. 2 illustrates a portion of the ΣΔ modulator-controlled PLL circuit shown in FIG. 1, here showing an exemplary ΣΔ modulator.

FIG. 2 illustrates the ΣΔ modulator 38 together with the dithering signal generator 44. The line 42 upon which the frequency input signals are applied to the modulator and the line 46 upon which the dithering signals are generated by the dithering signal generator 44 are again illustrated in the Figure.

The ΣΔ modulator 38 is here shown to be formed of a single-loop feedback circuit having two filters 52 and 54, here represented by G(z) and H(z). The modulator 38 also includes a quantizer 56 and summing elements 58 and 62. The filter 54 is coupled in a feedback connection between the output of the quantizer 56 and an input to the summing element 58. The line 42 is coupled to an input through the filter 52, and the output of the filter 52 is coupled to an input of the summing element 58. The output of the filter forms the signal related to the frequency input signal applied on line 42. Summed values formed by the summing element 58 are provided to an input to the summing element 62. And, the line 46 is coupled to an input of the summing element 62. The summing element sums the values provided thereto and provides a summed signal to the quantizer 56. Quantized values generated by the quantizer 56 form the division-factor control signal generated on the line 36.

The noise transfer function, NTF, and the signal transfer function, STF, of the modulator 38 are defined by the following equations:

$$NTF = \frac{\lambda}{1 + \lambda H(z)}$$

$$STF = \frac{\lambda G(z)}{1 + \lambda H(z)}$$

where $\lambda$ is the gain of the quantizer.

Through appropriate selection of the characteristics of the filters 52 and 54, desired noise shaping is effectuated, subject to stability requirements of the feedback arrangement, during operation of the modulator.

Particularly when the frequency input signals generated on the line 42 are of constant values or if the frequency input signals are related to the rate at which the signal is sampled, the modulator 38 might cause operation of the circuit 10, shown in FIG. 1, to exhibit repetitive behavior. The dithering signals generated by the dithering signal generator 44 and applied to the modulator 38 increase the randomness of the quantization noise of the modulator. Application of the dithering signals generated by the dithering signal generator reduces the likelihood that the modulator shall enter a limit cycle and generate repetitive outputs which result in the repetitive behavior of the PLL circuit 12.

As illustrated, the dithering signals are applied to the modulator prior to quantization by the quantizer 56. The transfer function of the dithering noise, DNTF, is the same as the noise transfer function, NTF, indicated by the previous equation caused by quantization. That is to say, DNTF equals NTF. Therefore, the dithering noise is subject to the same noise shaping as that of the quantization noise.

Figure 3:
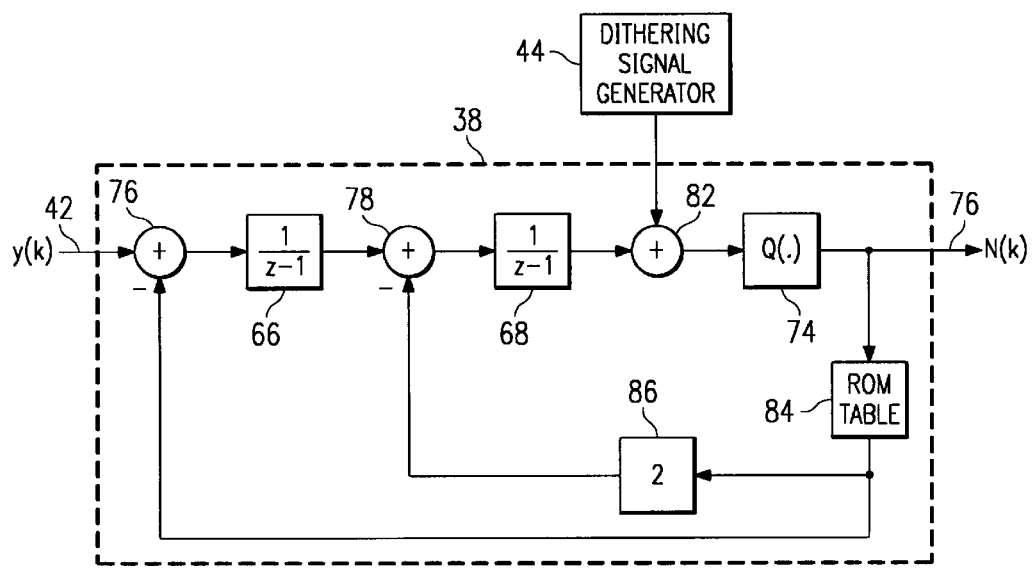
FIG. 3 illustrates a functional block diagram, similar to that shown in FIG. 2, here showing a second-order ΣΔ modulator according to an embodiment of the present invention.

FIG. 3 illustrates a second-order $\Sigma\Delta$ modulator 38, again together with a dithering signal generator 44. The modulator includes two filter elements, namely, filter elements 66 and 68. The modulator again includes a quantizer, here quantizer 74. And, the modulator includes three summing elements, elements 76, 78, and 82. The second order modulator includes two feedback paths, a first feedback path includes a ROM (read only memory) table 84 coupled between the output of the quantizer 74 and a negative input to the summing element 76. A second feedback path is formed of the ROM table 84 and a constant gain element 86. The second feedback path is coupled between the output of the quantizer 74 and a negative input to the summing element 78. The ROM is used for purposes of scaling as shall be noted by mathematical analysis which appears hereinbelow. In other embodiments, the functionality of the ROM is not required, and inclusion of the ROM is obviated.

Again, the dithering signals forming the dithering signal generated by the dithering signal generator 44 are summed together with signals representative of the frequency input signals generated on the line 42. Summation is performed prior to application to a quantizer, here the quantizer 74. Such addition of the pseudo-random values increases the randomness of the signal. And, the noise components of the quantized signal are shaped to form the division-factor control signal generated on the line 36. The dithering signals are applied just prior to the quantizer 74. Dithering noise caused by the dithering signals and quantization noise generated by the quantizer are, therefore, acted upon similarly.

Figure 4:
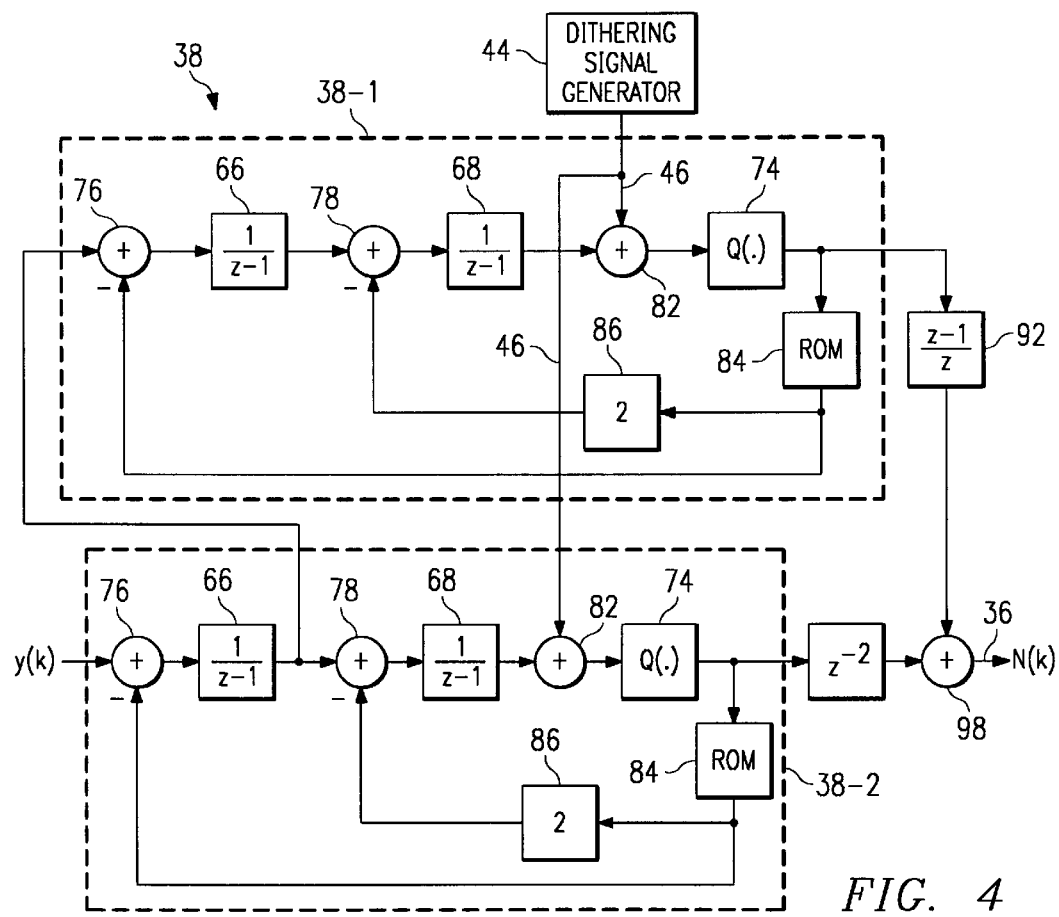
FIG. 4 illustrates a functional block diagram, also similar to that shown in FIG. 2, here showing a third-order ΣΔ modulator according to another embodiment of the present invention.

FIG. 4 also illustrates the $\Sigma\Delta$ modulator 38 together with the dithering signal generator 44. Here, the modulator 38 forms a third-order, feed-forward modulator. The modulator 38 shown in this Figure is sometimes also referred to as being a cascaded modulator or as a MASH (multi-stage noise shaping) modulator. The third-order modulator is formed of two second-order modulator portions, designated by 38-1 and 38-2, respectively. Each of the second-order modulator portions 38-1 and 38-2 include structure corresponding to that forming the second-order modulator 38 of the embodiment shown in FIG. 3. Common designations are used to identify the structure shown and described previously with respect to the second-order modulator 38 shown in FIG. 3.

The third-order modulator 38 further includes filters 92 and 94 which filter signals generated by the second-order, modulator portions 38-1 and 38-2. Filtered signals generated by the filters 92 and 94 are applied to inputs of a summing element 98. And, the summed signals formed thereat form the division-factor control signal generated on the line 36.

The dithering signal generator 44 generates dithering signals on the line 46. The line 46 is here coupled to input sides of the summing elements 82 of both of the modulator component portions 38-1 and 38-2.

Linear analysis of the modulator 38 shown in FIG. 4 indicates that the quantization noise, as well as the dithering noise, from the lower portion 38-2 of the modulator cancels. Therefore, as long as the $\Sigma\Delta$ modulator 38 exhibits sufficiently random behavior, only the quantization noise, and the dithering noise, of the upper portion 38-1 of the modulator affects the noise behavior of the modulator.

Analysis of the modulator 38 further indicates the noise transfer function, NTF, of the quantization noise of the upper portion 38-1 of the modulator 38 to be defined by the following equation:

$$NTS = \frac{(z-1)^3}{z^3}$$

As the transfer function is a third-order equation, the quantization noise and the dithering noise exhibited by the third-order modulator is shaped by a third-order amount. The dithering signal is filtered in the same manner as that which the quantization noise is filtered. Thereby the dithering noise and quantization noise are shaped in the same manner.

The quantizer 74 of the modulator portions 38-1 and 38-2 is an mth-level quantizer. An exemplary m-level quantizer, here a 5-level quantizer, is described by the following:

$$\hat{x} = Q(x) = \begin{cases} 2 & \text{if} & x > \frac{\alpha 3}{2} \\ 1 & \text{if} & \frac{\alpha 3}{2} \geq x > \frac{\alpha}{2} \\ 0 & \text{if} & \frac{\alpha}{2} \geq x > -\frac{\alpha}{2}, \\ -1 & \text{if} & -\frac{\alpha}{2} \geq x > -\frac{\alpha 3}{2} \\ -2 & \text{if} & -\frac{\alpha 3}{2} \geq x \end{cases}$$

where $\alpha$ is an element of the set in $\{1, 2, 3, \ldots\}$.

The ROM tablets 84 of the modulator portions 38-1 and 38-2 are each used in a manner to generate an output that is of a value α multiplied by the input value provided thereto by the quantizer. The value α defines a scaling factor which scales the quantization level. In other implementations, scaling can be performed in other manners.

The frequency resolution of the modulator 38 is the minimum frequency difference that can be generated by two different constant input signals to the modulator 38. The frequency resolution, $f_{res}$, is defined by the following equation:

$$f_{res}=f_{ref}/\alpha$$

The parameter α is a parameter that can be modified. Thereby, the frequency resolution of the modulator 38 and PLL circuit of which the modulator forms a portion can be controlled.

In a mobile terminal operable in a GSM cellular communication system, a value of $f_{ref}$ of 13 MHz, or a multiple thereof, is conveniently utilized. Such a value of $f_{ref}$ is advantageously utilized for the reason that channel spacing in symbol rates of a GSM cellular communication system are easily derivable from a 13 MHz frequency. When the PLL circuit 10 (shown in FIG. 1) forms a PLL-modulator (e.g., shown in FIG. 7), modulation for every GSM channel is able to be generated with a value of α={13e6/200e3}× β=65β, where β is an element of the set {1, 2, 3, . . . }.

Figure 5:
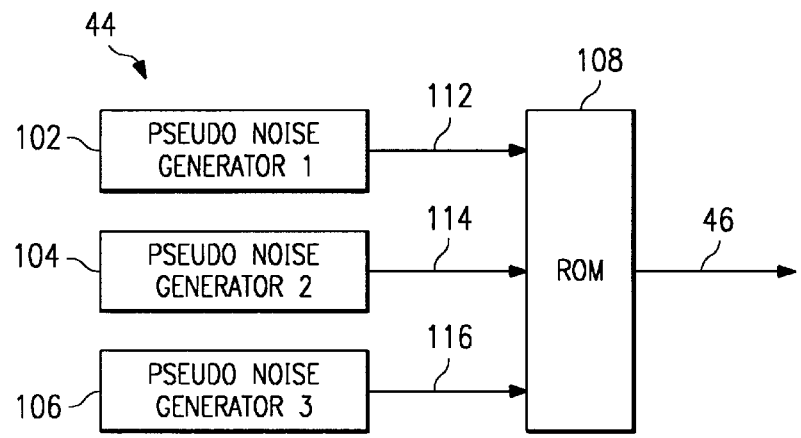
FIG. 5 illustrates a functional block diagram of a dithering signal generator, forming a portion of the ΣΔ modulator-controlled PLL circuit shown in FIG. 1.

FIG. 5 illustrates a dithering signal generator 44 forming a portion of the ΣΔ modulator-controlled PLL circuit shown in FIG. 1. The dithering signal generator 44 is here shown to be formed of three pseudo-random noise generators 102, 104, and 106 and a ROM 108. The pseudo-random noise generators 102, 104, and 106 generate single-bit values on the lines 112, 114, and 116, respectively, which are used to address the memory locations of the ROM 108. The values retrieved from the ROM 108 form the dithering signals which are generated on the line 46. Each memory location of the ROM 108 is formed of a multi-bit value. As described with respect to the preceding Figures, the dithering signals are applied to the ΣΔ modulator 38 and are summed together with signals representative of frequency input signals separately applied to the modulator.

In other embodiments, the dithering signals generated on the line 48 are pre-filtered and are added at other locations of the ΣΔ modulator. Also, in a cascaded, ΣΔ modulator, the dithering signals corresponding to different quantizers may be generated by independent dithering generators. And, in a multi-level modulator, dithering signals need not be added to each of the quantizers.

Figure 6:
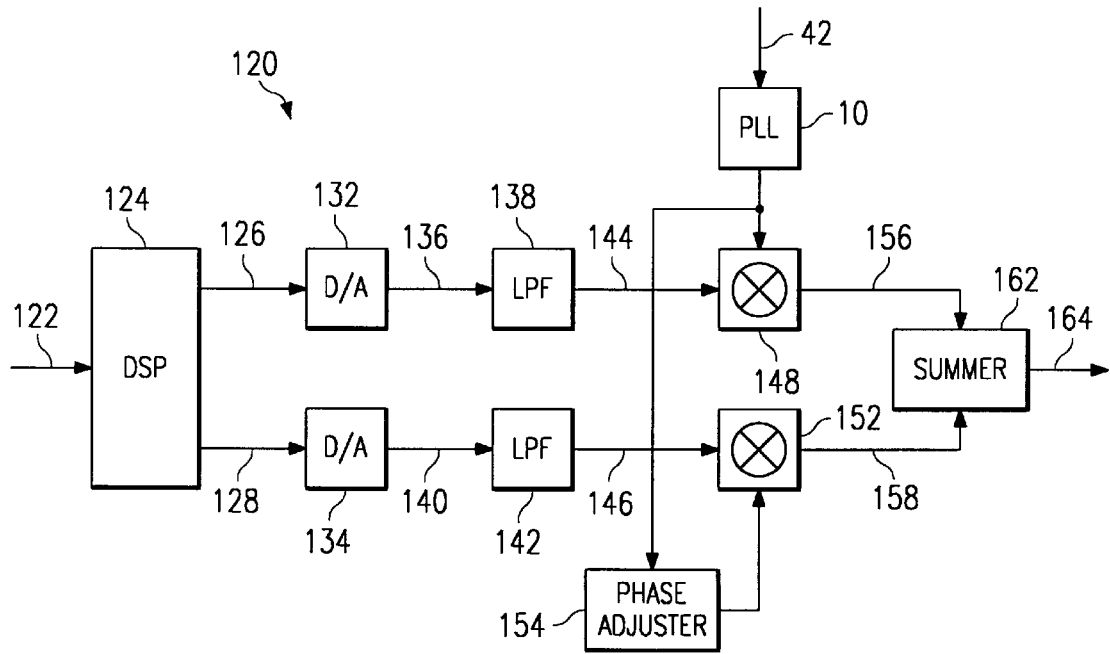
FIG. 6 illustrates an IQ modulator of which the ΣΔ modulator-controlled PLL circuit, shown in FIG. 1, forms a portion.

FIG. 6 illustrates an IQ modulator, shown generally at 120, of an embodiment of the present invention. The IQ modulator 120 includes the ΣΔ modulator-controlled PLL circuit 10, shown in FIG. 1, as a portion thereof. In this implementation, the PLL circuit 10 is operable as a frequency synthesizer for generating mixing signals of high frequency stabilities. The input signal to the circuit 10 on the line 42 is of a value corresponding to the frequency of the up-mixing signal to be applied for up-mixing purposes.

An information signal which is to be modulated by the IQ modulator 120 is provided thereto by way of the line 122. The line 122 is coupled to a DSP (digital signal processor) 124. The DSP 124 is operable to generate in-phase (I-) and quadrature-phase (Q-) component portions of the information signal applied thereto on the lines 126 and 128, respectively. The line 126 is coupled to a D/A (digital-to-analog) converter 132, and the line 128 is coupled to a D/A converter 134 whereat the I- and Q-component portions are converted into analog form.

The converter 132 generates an analog signal on the line 136 which is coupled to a low pass filter 138. And, the converter 134 generates an analog signal on the line 140 which is coupled to a low pass filter 142. The filters 138 and 142 generate filtered signals on the lines 144 and 146, respectively. The line 144 is coupled to an input of a multiplier 148, and the line 146 is coupled to an input of a multiplier 152.

The signal generated on the line 26 by the PLL circuit 10 is applied to a second input of the multiplier 148. And, the signal generated on the line 26 is applied, by way of a phase adjuster 154 to a second input of the multiplier 152. The phase adjuster introduces a 90° phase offset of the signal applied thereto, in conventional manner. The multipliers 148 and 152 thereby up-mix the I-component and Q-component signals applied thereto and generate up-mixed signals on the lines 156 and 158, respectively. The lines 156 and 158 are coupled to inputs of a summing element 162. The summing element 162 sums together the signals applied thereto and generates a combined signal on the line 164. The combined signal is thereafter amplified and transmitted.

Operation of the ΣΔ modulator-controlled PLL circuit 10 generates a signal of high frequency stability characteristics without exhibiting unwanted tones. Thereby the signal generated on the line 164 is of similar advantageous characteristics. High resolution in frequency is provided and fast frequency hopping is permitted.

Figure 7:
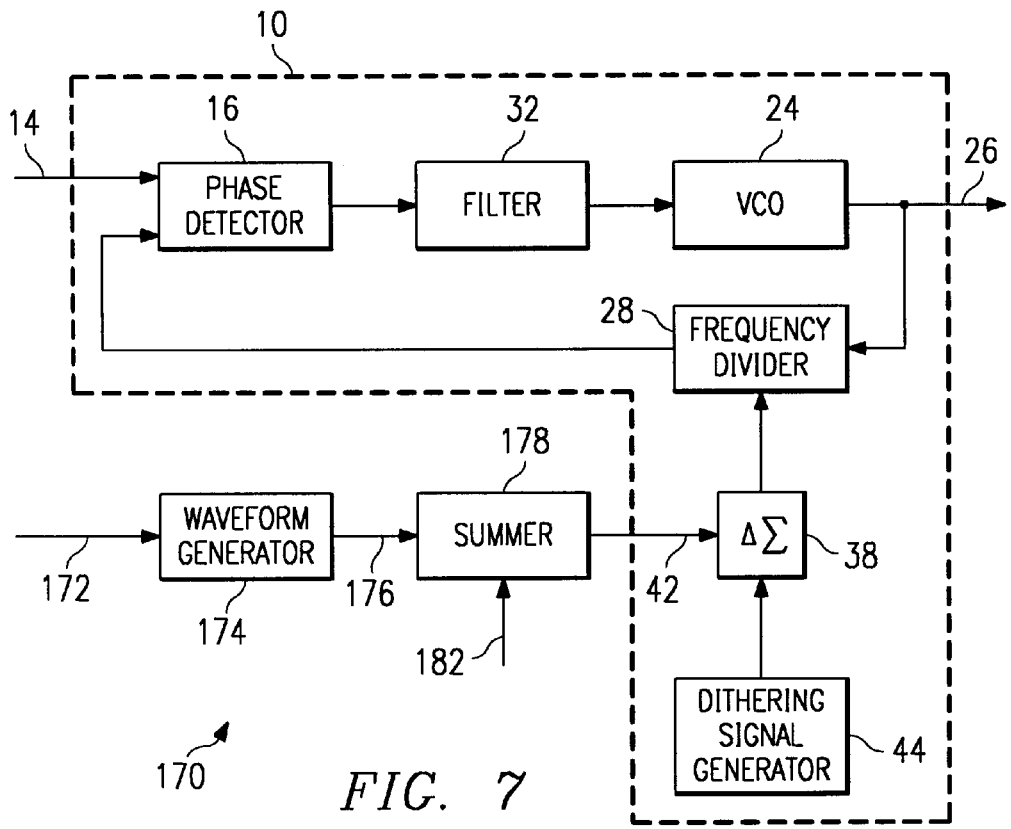
FIG. 7 illustrates a modulator of which the ΣΔ modulator-controlled PLL circuit, shown in FIG. 1, forms a portion.

FIG. 7 illustrates a PLL modulator, shown generally at 170, of an embodiment of the present invention. The PLL modulator 170 includes the ΣΔ modulator-controlled PLL circuit 10, shown previously in FIG. 1, as a portion thereof. Component portions of the PLL circuit 10 are again designated by the reference numerals used previously with respect to FIG. 1. The PLL modulator 170 is operable to modulate an information signal generated on the line 172 to form a modulated signal on the line 26.

The line 172 is coupled to a waveform generator 174. The waveform generator 174 is operable, responsive to values of the information signal provided thereto on the line 172, to generate instantaneous frequency values, divided by a reference frequency on the line 176. The line 176 is coupled to an input to a summing element 178. The summing element 178 is also coupled to receive an offset frequency signal generated on the line 182. The summing element 178 functions as a channel selector in which the offset frequency signal generated on the line 182 is used to generate channel offsets, as desired.

A summed signal is generated on the line 42. The line 42 is coupled to the ΣΔ modulator 38 to apply the summed signal thereto. The division factor of the frequency divider, controlled by the division-factor control signal generated on the line 36, permits the information signals generated on the line 172 to be modulated to form a modulated signal on the line 26. The band pass of the filter 32 is wide enough so as not to reject information component portions of the signal generated by the phase detector 16. GMSK (gaussian minimum shift keying) modulation, for instance, can be performed by the PLL modulator 170.

Figure 8:
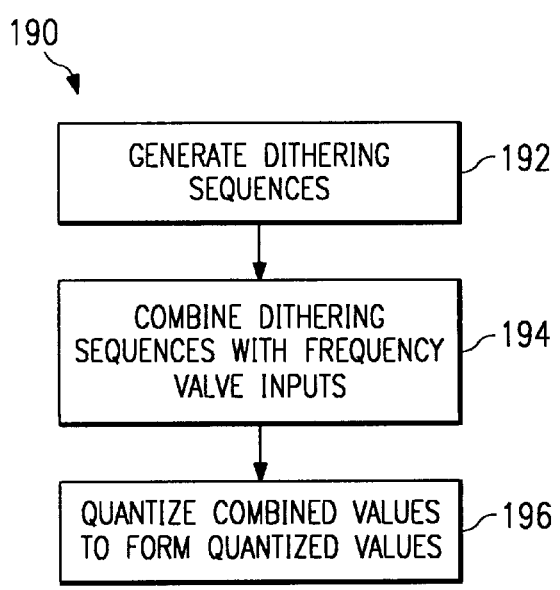
FIG. 8 illustrates a method flow diagram listing the method steps of an embodiment of the present invention.

FIG. 8 illustrates a method, shown generally at 190, of an embodiment of the present invention. The method generates a division-factor control signal for application to a frequency divider of a PLL circuit.

First, and as indicated by the block 192, dithering signals formed of at least pseudo-random values are generated. Then, and as indicated by the block 194, the dithering signals are combined with signals representative of the frequency input signals to form combined values. The frequency input signals have first characteristics.

Then, and as indicated by the block 196, the combined values are quantized to form quantized values. The quantized values have second characteristics and form the division-factor control signal which is applied to the frequency divider of the PLL circuit.

An embodiment of the present invention, therefore, provides a ΣΔ modulator-controlled, PLL circuit capable of generating a highly-stable signal which is unlikely to exhibit undesired tones. The ΣΔ modulator-controlled PLL circuit is implemented, for example, to form a frequency synthesizer or a PLL modulator. The circuit is amenable for any implementation in which a highly stable signal is required and is amenable, for instance, to form a portion of receiver or transmitter circuitry of a mobile terminal or a radio base station of cellular communication system.

The previous descriptions are of preferred examples for implementing the invention, and the scope of the invention should not necessarily be limited by this description. The scope of the present invention is defined by the following claims.

What is claimed is:

1. In a PLL (phase-locked-loop) circuit having a VCO (voltage-controlled oscillator) for generating a VCO output signal, the VCO regulated by an input reference signal and the VCO output signal coupled to a feedback loop having a frequency divider for dividing the VCO output signal by a selected division-factor, an improvement of apparatus for generating a division-factor control signal for application to the frequency divider, values of the division-factor control signal determinative of the selected division factor, said apparatus comprising:

a dither signal generator for generating dither signals of at least pseudo-random values;

a noise shaper coupled to receive sequences of frequency input signals having a first signal characteristic and to receive the dither signals generated by said dither signal generator, said noise shaper for generating responsive to summed values formed therefrom, the division-factor control signal, the division-factor control signal formed of division-factor control signals having a second signal characteristic; and wherein said dither signal generator comprises a memory device having memory locations for storing a plurality of values therein, the memory locations accessed in at least a pseudo-random manner, the values stored in the memory locations accessed in the pseudo-random manner forming at least portions of the dither signals.

2. A method of regulating operation of a VCO (voltage-controlled oscillator) which generates a VCO output signal and which forms a portion of a PLL (phase-locked loop) circuit, the PLL circuit coupled to receive an input reference signal, said method comprising the steps of:

coupling a frequency divider in a feedback loop to the VCO;

applying dither signals at an input of a quantizer of a ΣΔ modulator;

generating a division-factor control signal at the ΣΔ modulator, the ΣΔ modulator operable to shape at least noise components of summed values formed of frequency input sequences with the dither signals into desired characteristics;

applying the division-factor control signal to the frequency divider coupled during said step of coupling, values of the division-factor control signal determinative of a division-factor by which the frequency divider divides a feedback signal provided to the frequency divider;

dividing the feedback signal by the division factor to form a frequency-divided signal;

determining phase differences between the frequency-divided signal and the input reference signal; and adjusting oscillation of the VCO responsive to phase differences determined during said step of determining.

3. The apparatus of claim 1 wherein said dither signal generator further comprises at least one pseudo-random noise generator, said pseudo-random noise generator for generating pseudo-random noise values, the pseudo-random noise values used to address the memory locations of the memory device.

4. The apparatus of claim 3 wherein said at least one pseudo-random noise generator comprises a first pseudo-random noise generator for generating first pseudo-random bits, a second pseudo-random noise generator for generating second pseudo-random bits, and a third pseudo-random noise generator for generating third pseudo-random bits, and wherein three-bit combinations, each formed of a first pseudo-random bit, a second pseudo-random bit, and a third pseudo-random bit, form the pseudo-random noise values used to address the memory locations of the memory device.

5. The apparatus of claim 1 wherein said noise shaper comprises a ΣΔ modulator.

6. The apparatus of claim 5 wherein said ΣΔ modulator comprises a quantizer and wherein the frequency input signals and dither signals are summed together prior to application to said quantizer.

7. The apparatus of claim 5 wherein said ΣΔ modulator comprises a multi-order ΣΔ modulator.

8. The apparatus of claim 7 wherein said ΣΔ modulator comprises a third-order, feed forward ΣΔ modulator formed of a first, second-order ΣΔ modulator and a second, second-order ΣΔ modulator connected together in a cascaded connection.

9. In a PLL (phase-locked-loop) circuit having a VCO (voltage-controlled oscillator) for generating a VCO output signal, the VCO regulated by an input reference signal and the VCO output signal coupled to a feedback loop having a frequency divider for dividing the VCO output signal by a selected division-factor, an improvement of apparatus for generating a division-factor control signal for application to the frequency divider, values of the division-factor control signal determinative of the selected division factor, said apparatus comprising:

a dither signal generator for generating dither signals of at least pseudo-random values;

a noise shaper coupled to receive sequences of frequency input signals having a first signal characteristic and to receive the dither signals generated by said dither signal generator, said noise shaper for generating responsive to summed values formed therefrom, the division-factor control signal, the division-factor control signal formed of division-factor control signals having a second signal characteristic; and wherein:
said noise shaper comprises a ΣΔ modulator;
said ΣΔ modulator comprises a multi-order ΣΔ modulator;
said ΣΔ modulator comprises a third-order, feed forward ΣΔ modulator formed of a first, second-order ΣΔ modulator and a second, second-order ΣΔ modulator connected together in a cascaded connection; and
the first, second-order ΣΔ modulator comprises a first quantizer and the second, second-order ΣΔ modulator comprises a second quantizer, and wherein dithering signals are summed together with frequency-value input signals at each of the first and second ΣΔ modulators, respectively, prior to application to the first and the second quantizers, respectively.

10. The apparatus of claim 1 further comprising a clock signal generator coupled to said noise shaper and to said dither signal generator, said clock signal generator for generating a clock signal, said noise shaper and said dither signal generator operable responsive to detection thereat of individual clock pulses of the clock signal.

11. The apparatus of claim 1 further comprising a clock signal generator coupled to said noise shaper, said clock signal generator for generating a clock signal, said noise shaper operable to perform signal-shaping operations responsive to detection thereat of selected clock pulses of the clock signal.

12. The apparatus of claim 1 further comprising a clock signal generator couple to said dither signal generator, said clock signal generator for generating a clock signal, said dither signal generator operable to generate dither signals responsive to detection thereat of selected clock pulses of the clock signal.

13. The apparatus of claim 12 wherein the input reference signal to which the VCO is locked is generated at a first characteristic frequency and wherein the clock signal generated by said clock signal generator is of a clock signal frequency substantially corresponding to the first characteristic frequency.

14. The apparatus of claim 1 wherein the frequency input signals, which said noise shaper is coupled to receive, comprise signals defining a selected carrier frequency.

15. The apparatus of claim 1 wherein the frequency input signals, which said noise shaper is coupled to receive, comprise signals defining an information signal.

16. A radiotelephonic device having a division-factor selection signal generator circuit for generating a division-factor control signal, values of the division-factor control signal, when applied to a frequency divider, determinative of a division factor of the frequency divider, the division-factor selection signal generator circuit of said radiotelephonic device comprising:

a dither signal generator for generating dither signals of at least pseudo-random values;

a noise shaper coupled to receive frequency input signals having a first signal characteristic and to receive the dither signals generated by said dither signal generator, said noise shaper for generating, responsive to the dither signals and the frequency input signals, the division-factor control signal, the division-factor control signal formed of division-factor control sequences having a second signal characteristic; and wherein said dither signal generator comprises a memory device having memory locations for storing a plurality of values therein, the memory locations accessed in at least a pseudo-random manner, the values stored in the memory locations accessed in the pseudo-random manner forming at least portions of the dither signals.

17. A method for generating a division-factor control signal for application to a frequency divider of a PLL (phase-locked-loop) circuit, said method comprising the steps of:

generating dither signals formed of at least pseudo-random values, said step of generating dither signals comprising the steps of accessing in at least a pseudo-random manner a memory device having memory locations for storing a plurality of values therein and forming at least portions of the dither signals based, at least in part, on the plurality of values accessed from the memory locations;

combining the dither signals generated during said step of generating with frequency input signals to form combined values, the frequency input signals having first characteristics; and quantizing the combined values formed during said step of combining to form quantized values, the quantized values having second characteristics, and the quantized values forming the division-factor control signal.

18. The method of claim 17 wherein said steps of combining and quantizing together shape at least noise component portions of the frequency-value inputs.

19. A method of regulating operation of a VCO (voltage-controlled oscillator) which generates a VCO output signal and which forms a portion of a PLL (phase-locked loop) circuit, the PLL circuit coupled to receive an input reference signal, said method comprising the steps of:

coupling a frequency divider in a feedback loop to the VCO;

generating a division-factor control signal at a ΣΔ modulator, the ΣΔ modulator operable to shape at least noise components of summed values formed of frequency input sequences with dither signals into desired characteristics, the dither signals derived from, at least in part, values retrieved from memory locations of a memory accessed pseudo-randomly;

applying the division-factor control signal to the frequency divider coupled during said step of coupling, values of the division-factor control signal determinative of a division-factor by which the frequency divider divides a feedback signal provided to the frequency divider;

dividing the feedback signal by the division factor to form a frequency-divided signal;

determining phase differences between the frequency-divided signal and the input reference signal; and adjusting oscillation of the VCO responsive to phase differences determined during said step of determining.

20. In a PLL (phase-locked-loop) circuit having a VCO (voltage-controlled oscillator) for generating a VCO output signal, the VCO regulated by an input reference signal and the VCO output signal coupled to a feedback loop having a frequency divider for dividing the VCO output signal by a selected division-factor, an improvement of apparatus for generating a division-factor control signal for application to the frequency divider, values of the division-factor control signal determinative of the selected division factor, said apparatus comprising:

a dither signal generator for generating dither signals of at least pseudo-random values; and a noise shaper coupled to receive sequences of frequency input signals having a first signal characteristic and to receive the dither signals generated by said dither signal generator, said noise shaper including:

at least one filter for filtering the sequences of frequency input signals and generating a filtered signal formed of filtered signals having a second signal characteristic, at least one summer for summing the dither signals and the filtered signals to produce summed values, and at least one quantizer for quantizing the summed values, whereby said noise shaper generates responsive to the summed values, the division-factor control signal, the division-factor control signal formed of division-factor control signals having a third signal characteristic.

21. The apparatus of claim 20 wherein said dither signal generator comprises a memory device having memory locations for storing a plurality of values therein, the memory locations accessed in at least a pseudo-random manner, the plurality of values stored in the memory locations accessed in the pseudo-random manner forming at least portions of the dither signals.

22. The apparatus of claim 21 wherein said dither signal generator further comprises at least three pseudo-random noise generators, said at least three pseudo-random noise generators for generating pseudo-random noise values, the pseudo-random noise values used to address the memory locations of the memory device.

23. The apparatus of claim 20 wherein said dither signal generator comprises at least one maximum length pseudo-noise sequence generator.

24. The apparatus of claim 20 wherein said noise shaper comprises a $\Sigma\Delta$ modulator.

25. The apparatus of claim 24 wherein said $\Sigma\Delta$ modulator comprises a multi-order $\Sigma\Delta$ modulator.

26. The apparatus of claim 20 wherein a clock clocks both said dither signal generator and said noise shaper.

27. The apparatus of claim 20 wherein said dither signal generator is clocked by a clock having a frequency that is equal to a reference frequency of the input reference signal.

28. The apparatus of claim 20 wherein the frequency input signals, which said noise shaper is coupled to receive, comprise signals defining at least one of a selected carrier frequency and an information signal.

29. A radiotelephonic device having a division-factor selection signal generator circuit for generating a division-factor control signal, values of the division-factor control signal, when applied to a frequency divider, determinative of a division factor of the frequency divider, the division-factor selection signal generator circuit of said radiotelephonic device comprising:

a dither signal generator, said dither signal generator generating dither signals of at least pseudo-random values; and a noise shaper, said noise shaper including a filter and a quantizer, the filter coupled to receive frequency input signals having a first signal characteristic and to produce filtered signals having a second signal characteristic, the quantizer coupled to receive values derived from both the dither signals and the filtered signals, said noise shaper generating, responsive to the received values, the division-factor control signal, the division-factor control signal formed of division-factor control sequences having a third signal characteristic.

30. A method for generating a division-factor control signal for application to a frequency divider of a PLL (phase-locked-loop) circuit, said method comprising the steps of:

generating dither signals formed of at least pseudo-random values;

receiving frequency input signals, the frequency input signals having first characteristics;

filtering the frequency input signals to produce filtered signals having second characteristics;

combining the dither signals generated during said step of generating with the filtered signals to form combined values; and quantizing the combined values formed during said step of combining to form quantized values, the quantized values having third characteristics and forming the division-factor control signal for application to the frequency divider.

31. The method of claim 30 wherein said steps of combining and quantizing together shape at least noise component portions of the frequency input signals.

* * * * *

UNITED STATES PATENT AND TRADEMARK OFFICE
CERTIFICATE OF CORRECTION

PATENT NO.  : 5,986,512
DATED       : November 16, 1999
INVENTOR(S) : Eriksson

It is certified that error appears in the above-identified patent and that said Letters Patent is hereby corrected as shown below:

Column 9, line 1        Replace "tablets"
                            With --tables--

Column 13, line 19      Replace "couple"
                            With --coupled--

Signed and Sealed this

Twenty-second Day of May, 2001

Attest:

NICHOLAS P. GODICI

*Attesting Officer*        *Acting Director of the United States Patent and Trademark Office*